(12) United States Patent
Verdiell

(10) Patent No.: US 6,376,268 B1
(45) Date of Patent: *Apr. 23, 2002

(54) OPTOELECTRONIC ASSEMBLY AND METHOD OF MAKING THE SAME

(75) Inventor: Jean-Marc Verdiell, Palo Alto, CA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/334,146

(22) Filed: Jun. 15, 1999

Related U.S. Application Data

(62) Division of application No. 09/003,114, filed on Jan. 6, 1998, now Pat. No. 5,977,567.

(51) Int. Cl.[7] .................... H01L 21/00; H01L 33/00; H01L 31/0203
(52) U.S. Cl. .................... 438/26; 438/27; 257/99; 257/433
(58) Field of Search .................... 438/26, 27; 257/99, 257/433

(56) References Cited

U.S. PATENT DOCUMENTS

| 3,908,184 | A |   | 9/1975  | Anazawa |   |
|---|---|---|---|---|---|
| 4,114,177 | A |   | 9/1978  | King |   |
| 4,119,363 | A |   | 10/1978 | Camlibel et al. |   |
| 4,233,619 | A |   | 11/1980 | Webb et al. |   |
| 4,357,072 | A |   | 11/1982 | Goodfellow et al. |   |
| 4,893,901 | A |   | 1/1990  | Taumberger |   |
| 4,926,545 | A |   | 5/1990  | Pimpinella et al. |   |
| 5,026,134 | A | * | 6/1991  | Sugawara et al. | 350/96.11 |
| 5,119,448 | A |   | 6/1992  | Schaefer et al. |   |
| 5,123,074 | A |   | 6/1992  | Yokota et al. |   |
| 5,163,108 | A |   | 11/1992 | Armiento et al. |   |
| 5,475,775 | A | * | 12/1995 | Kragl | 385/14 |
| 5,610,395 | A |   | 3/1997  | Nishiyama |   |
| 5,641,984 | A |   | 6/1997  | Aftergut |   |
| 5,833,202 | A |   | 11/1998 | Wolfgang |   |
| 5,915,163 | A | * | 6/1999  | Noordermeer | 438/33 |

\* cited by examiner

Primary Examiner—Charles Bowers
Assistant Examiner—Nema Berezny
(74) Attorney, Agent, or Firm—Blakely, Sokoloff, Taylor & Zafman LLP

(57) ABSTRACT

An optoelectronic assembly having an insulating substrate with a planar surface and a metal layer bonded to the planar surface such that selected regions of the substrate are exposed and a step is produced between the substrate and a top surface of the metal layer. An active optical device is mounted on the metal layer and a passive optical device is aligned with the active device using the step as a fiduciary for positioning the former. The metal layer provides an electrical path to the active device. The thickness of the metal layer is selected such that the heat generated by the active device is dissipated, the substrate does not interfere with the propagation of light along the first optical axis, and such that the in-plane coefficient of thermal expansion (CTE) of the metal layer is constrained by the substrate. The optoelectronic assembly is also suitable for mounting active devices provided with submounts or without.

33 Claims, 7 Drawing Sheets

OPTOELECTRONIC ASSEMBLY AND METHOD OF MAKING THE SAME

This Appln is a Div of Ser. No. 09/003,114 filed Jan. 6, 1998, U.S. Pat. No. 5,997,567.

FIELD OF THE INVASION

This invention relates to an optoelectronic assembly and, more specifically, to a method and assembly for mounting active and passive optical devices and elements.

BACKGROUND OF THE INVENTION

Optoelectronic components or active optical devices such as diode lasers, light-emitting diodes (LEDs) and photodiode detectors are used for printing, data storage, optical data transmission and reception, as well as pumping of high power lasers and a multitude of other applications. Optoelectronic packages are intended to provide a way for mounting passive and active optical elements and devices, as well as electrical components, in a robust structure which preserves proper alignment. Typically, an optoelectronic package includes an assembly upon which the optoelectronic components are mounted. The requirements of a package depend upon the application. In most cases, a package should provide precision alignment for the internal components, enable high speed electrical operation, provide for heat dissipation, match the coefficient of thermal expansion (CTE) between the mount and the device, and provide for simple external electrical connections and hermetic sealing. In addition, the package should be mechanically robust and be highly reliable. Clearly, satisfying all of these requirements calls for a judicious choice of materials and mounting techniques. In cases where numerous optical parts including other active devices and passive optical elements, e.g. lenses, gratings, fibers, mirrors and the like are intended to cooperate with each other, alignment of these parts with respect to each other is crucial.

These requirements have resulted in packages that are an order of magnitude larger, costlier, and more difficult to manufacture than purely electronic packages. In fact, the cost of most optoelectronic devices is dominated by the package rather than the optical devices themselves. New optoelectronic technologies will not succeed in the marketplace if the cost of packaging remains as high as it is now.

In a laser-fiber coupler, for example, the relative positions of fibers, lenses, mirrors and lasers must be precisely adjusted and permanently fixed to maintain beam coupling efficiency. Single-mode optical fibers, for example, require optical alignment tolerances of less than 1 $\mu$m while multi-mode optical fibers require optical alignment tolerances of less than 10 $\mu$m. To achieve precision alignment, the optoelectronic device is operated and monitored while the optical components are moved. The components are typically secured in place once a coarse alignment is achieved and then fine-tuned for optimal performance.

Precision alignment is complicated by the expansion and contraction of package materials during temperature fluctuations brought about primarily by the heat required to attach (solder) the individual active optical devices and variations in ambient temperature. Many prior art techniques use materials with varied coefficients of thermal expansion (CTEs). During thermal cycling the components of an optoelectronic device can drift out of alignment causing poor performance or even complete malfunction. Also, the mechanical stress produced can damage the components.

Existing packaging techniques often require that packages be manufactured individually. For example, individual constituent mechanical components of a package may be assembled into a finished device one at a time in an assembly line process. Batch processing techniques have been developed which can fabricate large numbers of optoelectronic assemblies. These techniques, however, are usually limited in their ability to manufacture a wide variety of optoelectronic devices and result in performance sacrifices. This is chiefly due to a high number of parts and a reliance on 3-D alignment. For example, conventional TO cans and high performance butterfly packages are not planar and thus their production cannot be easily automated.

The cost of present devices is further increased by the fact that optoelectronic assemblies frequently reside on substrates which need to be mounted on other substrates to produce the final package. For example, optoelectronic components mounted on silicon, a frequently-used material, must be remounted when placed in an optoelectronic package. Silicon is problematic for high-speed optoelectronic packages because it is a rather lossy dielectric. Progress in the fields of optics and electronics yields ever faster optoelectronic devices and therefore, this characteristic of silicon is limiting. Also, silicon is a brittle material susceptible to cracking and chipping, a liability in mechanically demanding applications. Further, its thermal conductivity is far lower than that of conventional heatsinks such as copper.

The teachings of U.S. Pat. No. 4,357,072, 4,119,363, and 4,233,619 hinge on proper placement and alignment of the optical and electronic components in three dimensions. Under these circumstances, the alignment of a fiber to a laser or the alignment of a lens to a detector is very difficult. Each component must be actively positioned, incurring all the expense associated with active alignment. Due to their design, these packages preclude the use of batch process manufacturing techniques. Also, high speed operation is problematic since these packages use numerous electrical connections and have complex geometries. Because the packages include dissimilar materials, great care is required to ensure that the differences in the CTEs of the materials do not cause misalignment during temperature fluctuations. This situation often leads package designers to compromise between heat dissipation and mechanical stability requirements.

Another disadvantage of these assemblies is the fact that they require a relatively large number of steps to fabricate. Each assembly has numerous subassemblies and, in general, one step is required for fabricating each subassembly. In turn, multiple steps and large numbers of subassemblies increase the cost, complexity and size of the package.

A technique for providing passive alignment between a plurality of diode lasers and optical fibers is described in U.S. Pat. No. 5,163,108. By forming alignment pedestals on the substrate for holding the laser chip and grooves in the substrate for holding optical fibers, simple alignment is accomplished. Unfortunately, this technique is limited because it does not provide an adaptable method for including other optical components such as lenses or mirrors. Further, the technique does not provide for enhanced heat dissipation for active elements generating large amounts of heat.

U.S. Pat. No. 5,123,074 describes a substrate for mounting active and passive optical elements and optical components. The substrate is made of an insulating block with metal regions formed for electrical connections and for mounting components. A reversed structure with a metal block and insulating regions is also described. Electrical circuits are formed on the insulating regions with the metal regions serving as bonding pads for the optical hardware. In the embodiment with an underlying metal block, the metal block acts as a ground plane, enhancing the high speed electrical characteristics of the substrate. The surfaces of the metal and insulating regions of the substrate lie in one plane, so that the substrate provides no mechanical alignment. Thus, this invention has the disadvantage of requiring the components to be actively aligned. Also, since the surface of the substrate is a single plane, different components cannot be mounted at different heights to allow for optical alignment.

U.S. Pat. No. 4,926,545 discloses a batch process for manufacturing optoelectronic assemblies. The assemblies can provide passive alignment or simplified active alignment for optoelectronic and optical components. The device includes metalization patterns for aiding alignment. The metalization patterns act as visual alignment aids for the placement of components. A problem with this device is that it uses silicon and therefore has all the disadvantages associated with silicon optoelectronic substrates. In addition, the process only provides for device positioning in which the optical axes are perpendicular to the substrate. This limits the ability of an optoelectronic circuit designer since orienting the optical axes parallel to the substrate allows one to design more complex optoelectronic circuits in a smaller space.

U.S. Pat. No. 5,119,448 discloses a method of making a substrate for mounting optical components by forming relief structures into the surface of the substrate. The relief structures provide mechanical alignment for the components. This method is primarily concerned with mounting fiber arrays and using such fiber arrays as sensors. No provisions are made for incorporating active optoelectronic components such as lasers and using the substrate as an optoelectronic assembly. Further, this method does not yield an optoelectronic package, or assembly for a package, and requires at least two patterning steps.

In the prior art, no single optoelectronic packaging technique offers the simultaneous advantages of high speed electrical operation, adaptability to produce various optoelectronic devices, adaptability to batch processing, effective heat dissipation and resistance to misalignment caused by changes in temperature. Yet a combination of these characteristics is very desirable for further progress in the field of optoelectronic packaging and circuit design.

OBJECTS AND ADVANTAGES OF THE INVENTION

In view of the above, it is an object of the present invention to provide an optoelectronic assembly which allows one to mount active optical devices, passive optical devices, and electronic components. The optoelectronic assembly may be used in optoelectronic packages and is compatible with any combination of active and passive optical devices and electronic components.

Another object of the invention is to provide a method for making the optoelectronic assembly. The method is particularly well-suited for batch processing fabrication. Additionally, the method is compatible with pick and place manufacturing techniques to achieve simple, precise, and reproducible active alignment of the active and passive devices and elements.

A further object of the invention is to provide an optoelectronic assembly which is compatible with high-speed electrical operation and which exhibits superior heat dissipation capability and mechanical stability over a wide temperature range.

Another object of the invention is to provide CTE matching between the optoelectronic components and the assembly. This increases device life and allows for a wider range of operating temperatures.

These and other objects and advantages will become apparent upon consideration of the ensuing description and the accompanying drawings.

SUMMARY

These objects and advantages are achieved by an optoelectronic assembly having an insulating substrate with a planar surface and a metal layer bonded to the planar surface such that selected regions of the substrate are exposed and a step is produced between the substrate and a top surface of the metal layer. An active optical device such as a diode laser, optical amplifier, optical modulator, light detector or any other device is mounted on the metal layer. The active device has a first optical axis and in this arrangement this axis is parallel to the substrate. In addition, the metal layer provides an electrical path to the active device. It is essential for the optoelectronic assembly that the metal layer have a well-defined thickness. This thickness is selected such that the heat generated by the active device is dissipated, the substrate does not interfere with the propagation of light along the first optical axis, and such that the in-plane coefficient of thermal expansion (CTE) of the metal layer is constrained by the substrate.

Suitable thicknesses of the metal layer are between 50 $\mu$m and 1,000 $\mu$m. The metal layer is preferably made of a material selected from the group consisting of copper, copper-tungsten, copper alloys, copper composites, copper plated materials, copper clad materials, and copper laminates. The actual material selected will depend upon the purpose of the assembly and design specifications. The insulating substrate is thick enough to lend mechanical stability to the assembly, is a good dielectric for high speed electronics, and bonds well with metal. Alumina, BeO and AlN are good examples.

The optoelectronic assembly of the invention further admits a passive optical element with a second optical axis positioned in one of the selected regions. The positioning of this passive optical element should be such that the second optical axis is aligned with the first optical axis of the active device. Any passive elements such as optical fibers, lenses, filters, diffraction gratings, beam splitters, isolators and mirrors may be placed on the substrate.

In the preferred embodiment, the optoelectronic assembly incorporates square lenses and square isolators. An example of square lenses are graded index of refraction (GRIN) lenses, such as Gradium lenses. The metal layer is patterned as an electrical circuit and electrical components are mounted on the metal layer. This is particularly advantageous for highly integrated packages which include all three types of components, i.e. active and passive optical elements and electrical parts.

A bottom metal layer can be bonded to the insulating substrate opposite the planar surface. This second layer can also be patterned as an electrical circuit. In one embodiment the assembly with such a second layer has cooling elements mounted on the opposite side of the substrate. These cooling elements may include Peltier coolers. Micro-channel coolers using fluid coolants can also be patterned in the second layer of metal.

The method of making the optoelectronic assembly includes the steps of selecting the metal layer and substrate and bonding the metal layer to the substrate. In the patterning step, the metal layer is formed by photolithography, etching, stamping, electrodeposition or electro-discharge machining before bonding it to the substrate. Alternatively, photolithography or diamond is sawing is used to pattern the metal layer after the bonding step. The desired thickness is achieved by plating the metal layer on a thin metal film on the insulating substrate, or by a polish-back step. The active device may then be mounted on the metal layer.

During placing, the passive optical element is actively displaced in the selected region or is allowed to come to rest at the intended location under the force of gravity. In either case, the passive element moves along the step which serves as a mechanical fiduciary.

The method of the invention is particularly well-suited for batch processing. The assemblies are formed by patterning the metal layer on one large, flat insulating substrate which is then divided into at least two parts. Preferably, many assemblies are simultaneously produced. Bonding of the active devices on the metal layers can be performed before or after the dividing step. Likewise, the placement of passive elements can be performed before or after the dividing step, depending on the production process.

In still another embodiment, the active optical device is mounted on a submount and the step serves as a mechanical fiduciary to align the active optical device on this submount with any second active device or passive elements. The thickness of the submount is selected such that the optical axes of the components are aligned and the heat generated by the first active device is dissipated through the submount. A corresponding method is also a part of the invention.

The details of the invention will be better appreciated upon reading the detailed description below and referring to the drawing figures.

DETAILED DESCRIPTION

Figure 1:
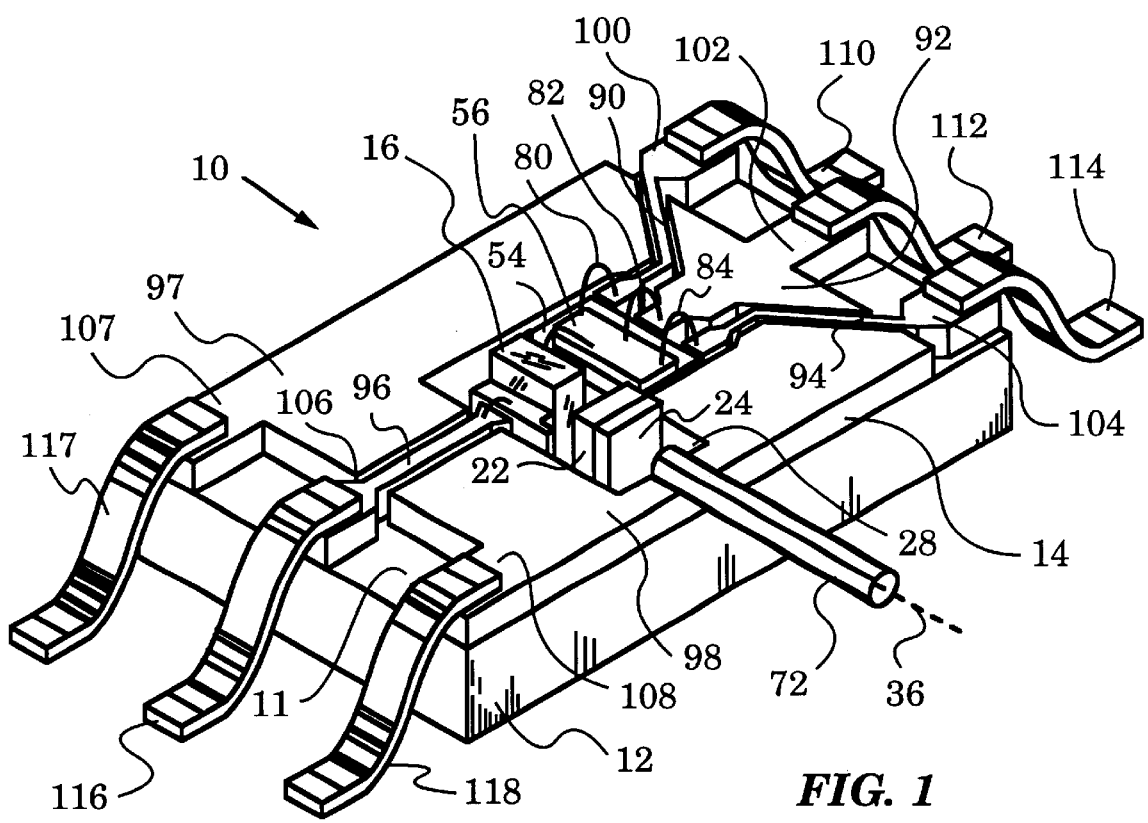
FIG. 1 is an isometric view of an optoelectronic assembly a according to the invention.

A preferred embodiment of an optoelectronic assembly 10 is illustrated in FIG. 1. Assembly 10 is built on an insulating substrate 12 which provides mechanical stability to entire assembly 10. The particular assembly 10 shown is a laser-fiber coupler as is commonly used to send optical signals. Suitable materials for substrate 12 are ceramics such as alumina, BeO and AlN. The overall stability and size restrictions on assembly 10 will dictate the thickness and material of choice of substrate 12 in specific instances.

A metal layer 14 is bonded on a planar face 11 of substrate 12. Suitable metals include copper, copper-tungsten, various copper alloys, copper composites, copper plated materials, copper clad materials, and copper laminates. Copper composites may be copper-molybdenum laminates or copper materials made from mixed copper powders. Metal layer 14 is preferably made of copper because of this metal's high electrical and thermal conductivity, low cost, and because it is easily direct bonded to alumina. The thickness T of layer 14 (see FIG. 3) ranges from 50 $\mu$m to 1,000 $\mu$m and most preferably is equal to about 250 $\mu$m. The actual thickness is determined according to rules described below.

Metal layer 14 is patterned to accommodate an active optical device 16 in the middle of assembly 10. In this case, optical device 16 is an edge-emitting diode laser with one terminal. In general, however, device 16 can be any optically active device such as an optical amplifier, an optical modulator or a light detector. Further, optical device 16 may have two, three or more input terminals. Passive optical elements 22, 24 are positioned in region 28 where substrate 12 is exposed. In this case, optical element 22 is a square isolator and optical element 24 is a spherical lens or square lens, such as a Gradium lens.

Figure 2:
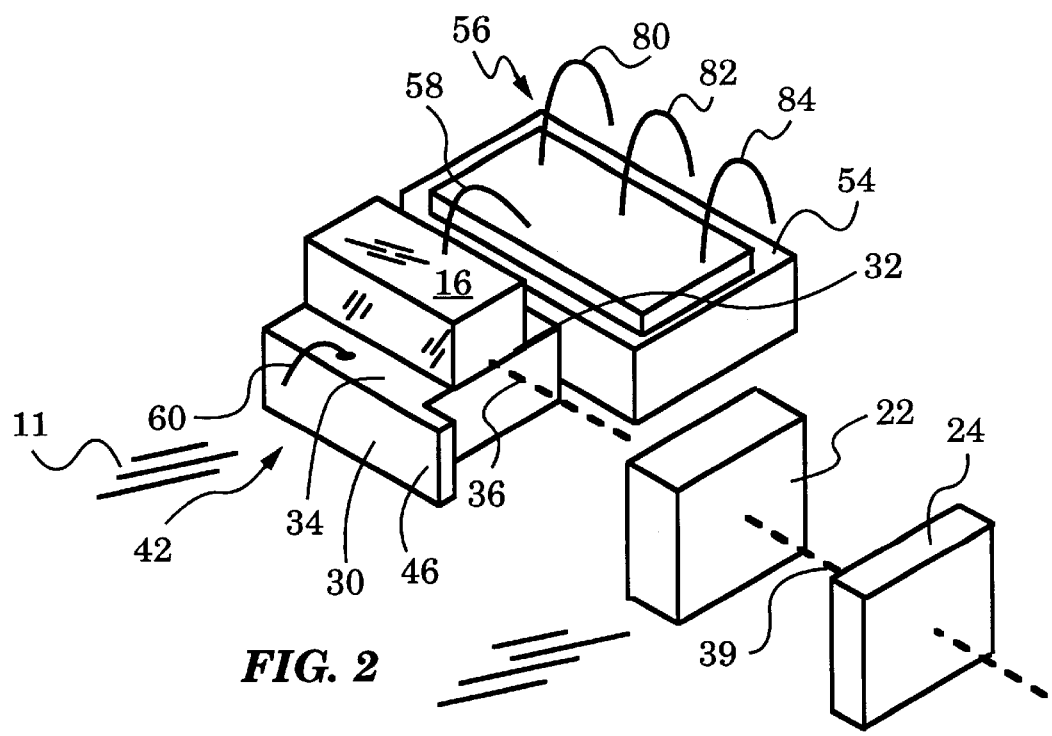
FIG. 2 is an isometric view of active and passive optical elements in the optoelectronic assembly of FIG. 1.

FIG. 2 affords a more detailed look at the positioning of these elements. Laser 16 is mounted on portion 30 such that an active edge 32 of laser 16 is at the height of a top surface 34 of metal layer portion 30. Thus, first optical axis 36 along which 30 light propagates from laser 16 is elevated above planar face 11 by a distance equal to the thickness of the metal layer portion 30 plus the depth of the laser portion in the laser die. In this way, the height of first optical axis 36 is selected by the thickness of metal layer portion 30. In many applications this is convenient because it is relatively easy to determine the precise thickness of metal layer portion 30. Furthermore, optical axis 36 is parallel to planar face 11. The laser cavity need not be at the surface of the die, however.

A metal layer portion 54 bears an integrated circuit 56 for controlling the laser. Signals are sent to the laser 16 via a lead 58. Specifically, lead 58 is connected to the first terminal of laser 16. Another lead 60 is connected to metal layer portion 30. Because portion 30 is made of a conductive metal, it provides an electrical path to laser 16 and in particular to the second terminal of laser 16. Thus, the two electrical connections required to control laser 16 are easily achieved. Since a person of average skill in the art will know how to properly connect the terminals of laser 16, they are not shown in the drawings.

Referring again to FIG. 1, an optical output fiber 72 has an optical axes aligned with optical axis 36. Fiber 72 can be single-mode or multi-mode depending upon the application. It is commonly known that more precise alignment tolerances (approximately 1 μm) are required for single-mode fibers than for multi-mode fibers (up to 10 μm). Fiber 72 is mounted on metal layer 14 by any suitable means. In the preferred embodiment, fiber 72 is placed in a groove and bonded to the groove. This is a standard technique well-known in the art.

A set of leads 80, 82 and 84 provide electrical connections to integrated circuit 56. To ensure operation at very high speeds, portions 90, 92 and 94 are preferably electrical transmission lines. Such transmission lines are necessary when laser diode 16 requires modulation or control signals in the GHz range. Furthermore, portions 90, 92 and 94 terminate at the right edge of substrate 12 in pads 100, 102 and 104 to which are soldered contact straps or pins 110, 112, and 114, respectively. Similarly, lead 60 is connected via metal layer portion 96, which is preferably also a transmission line, to pad 106 and pin 116. Two additional pins 117 and 118 are provided on pads 107 and 108 of metal layer portions 97 and 98.

Figure 3:
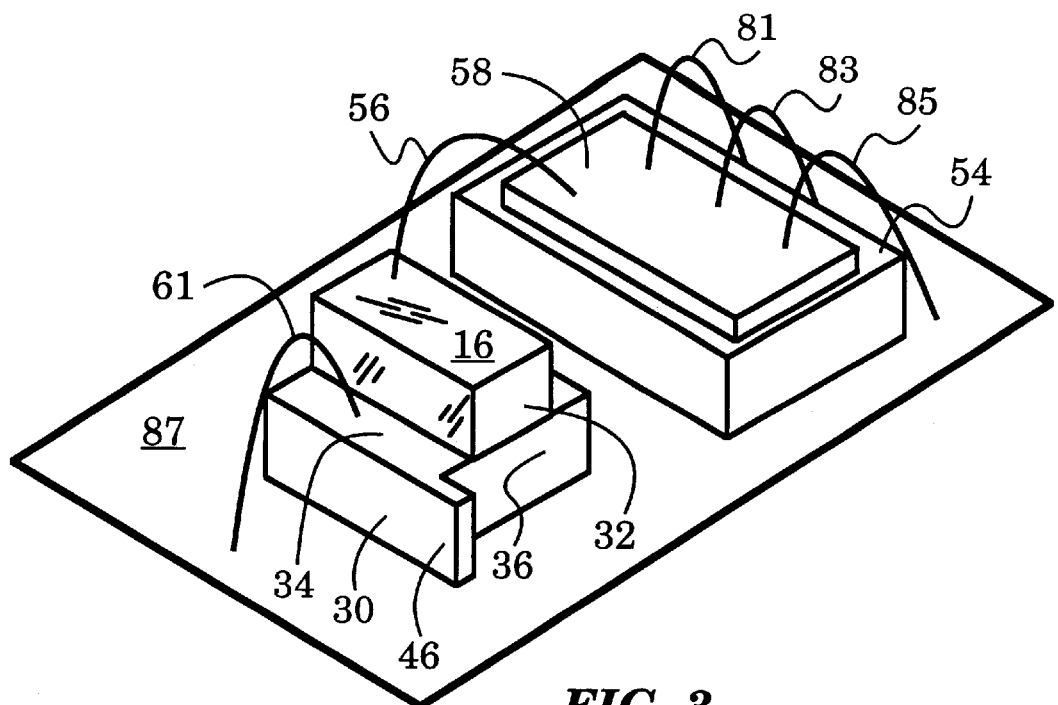
FIG. 3 is an isometric view of feed through lines of one embodiment.

In another embodiment, as shown in FIG. 3, feedthrough leads 81, 83 and 85 are used instead of leads 80, 82 and 84. Feedthrough leads 81, 83 and 85 connect integrated circuit 56 to an electrical transmission substrate 87 located beneath integrated circuit 56, removing the need for electrical transmission lines 90, 92 and 94; pads 100, 102 and 104; and straps or pins 110, 112 and 114. Likewise, feedthrough lead 61 replaces lead 60 and removes the need for electrical transmission line 96, pad 106 and pin 116.

Referring again to FIG. 1, non-resident or external circuitry (not shown) communicates with integrated circuit 56 of assembly 10 via pins 110, 112 and 114. Direct communication with laser 16 is obtained via pin 116. In the present case pins 117 and 118 are not required for operating assembly 10.

It is essential for proper operation of assembly 10 that metal layer 14 and especially metal layer portion 30, have a certain thickness T in the range from 50 to 1,000 μm. In particular, thickness T is set to optimize three different parameters. The cross sectional view of FIG. 4 best explains the rationale in selecting thickness T in a specific case.

First, the heat generated by active device 16 must be dissipated by conducting it through metal layer portion 30 to substrate 12. In general, the effectiveness of metal layer portion 30 in its function as a heat sink will improve with increasing thickness T. A list of thermal conductivity and thermal expansion values for materials used as metal layer 14 (specifically, portion 30), active device 16, and substrate 12 is provided in Table 1.

TABLE 1

| Material | Coefficient of Thermal Expansion, CTE, × $10^{-6}$/° C. | Thermal Conductivity W/m-° C. |
| --- | --- | --- |
| Alumina | 7.0 | 18.0 |
| BeO | 6.4 | 280 |
| Copper | 17.5 | 392 |
| Copper/Tungsten | 7.0 | 248 |
| GaAs | 6.5 | 53 |
| Silicon | 4.2 | 130 |

Second, thickness T of metal layer 14 has to be large enough such that substrate 12 does not interfere with the propagation of light along first optical axis 36. Thus, when a light beam 120 is emitted by laser 16 along first optical axis 36 at a divergence angle α the light should not scatter off substrate 12 before reaching isolator 22. This restriction is purely geometrical and dictates a minimum thickness T dependent upon angle α and the distance from the emitting edge of laser 16 to isolator 22. Preferably, the thickness of the metal layer 14 (portion 30) is such that the laser 16, isolator 22 and lens 24 share a common optic axis.

Third, thickness T should be sufficiently thin for substrate 12 to constrain the thermal expansion of metal layer portion 30 during changes in temperature. In particular, the in-plane coefficient of thermal expansion (CTE) of portion 30 should be constrained to the CTE of substrate 12. Generally, the metal layer 14 will have a CTE greater than the CTE of the substrate.

The above three conditions are satisfied, for example, when metal layer 14 is made of copper, thickness T of metal layer portion 30 is about 250 μm, the distance to isolator 22 is 300 μm, and substrate 12 is made of alumina. From Table 1 it can be seen that the CTE of alumina is much less than the CTE of copper. Since thickness T of metal layer portion 30 is considerably smaller than the thickness of substrate 12, and the insulating substrate 12 is stiffer than the metal layer 14, metal layer portion 30 will be prevented from expanding in-plane, i.e. parallel to substrate 12, at its natural rate during temperature cycling. In other words, the copper making up metal layer portion 30 will inherit the in-plane CTE of the underlying alumina making up substrate 12. Thus, by selecting a particular material for substrate 12, metal layer 14 (portion 30) can be forced to have a desired in-plane CTE.

The advantage of constraining the in-plane CTE of metal layer 14 is that misalignments between optical components during operation are prevented. In particular, laser 16 will not god undergo any relative position changes with respect to lens 22 positioned on substrate 12. Analogously, the alignment of laser 16 with isolator 22, lens 24 and fiber 72 (see FIG. 1) will be preserved. Another advantage is that the GaAs chip is not stressed, improving reliability. The mechanical stability of optoelectronic assembly 10 is also improved.

Most optoelectronic components, such as laser 16, are stress sensitive and are made from compound semiconductors that have CTEs that are close to the CTE of alumina. The CTE for GaAs, for example, is given in Table 1. Since metal layer 14 inherits the in-plane CTE of alumina, optoelectronic components made from compound semiconductors can be safely mounted on layer 14. Thus, in general, the in-plane CTE matching technique allows for the relatively stress free bonding of large area electronic and optoelectronic components to metal layer 14. In fact, referring back to FIG. 2, integrated circuits 56 made from silicon or GaAs are safely mounted on metal layer portion 54 and experience reduced thermal expansion-induced mechanical stress.

Integrated circuit 56 residing on metal layer portion 54 is driven by external circuitry (not shown) which sends appropriate control signals through pins 110, 112, 114, electrical micro-wave waveguides 90, 92, 94 and leads 80, 82 and 84. An electrical path is also provided via pin 116, transmission line 96, lead 60 and metal layer portion 30 to the second terminal of laser 16. Thanks to this construction electrical control signals in the GHz frequency range can be delivered to control the gain and other working parameters of laser 16.

Figure 4:
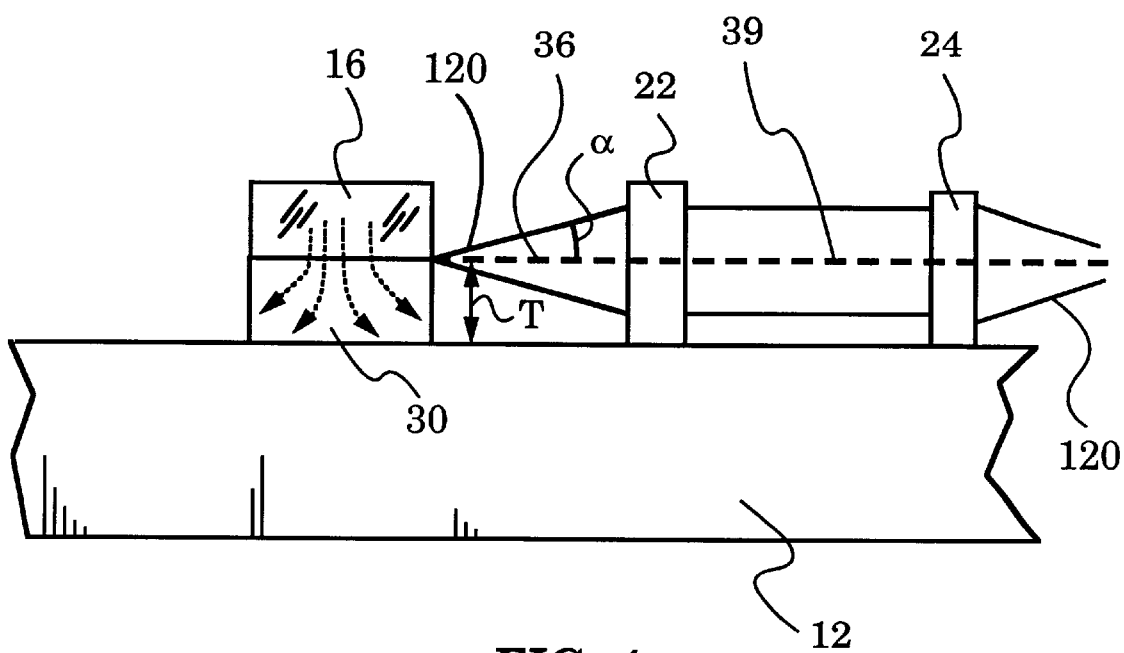
FIG. 4 is a cross sectional view along a first optical axis of the view in FIG. 2.

During operation laser 16 generates heat which is dissipated through metal layer portion 30, as shown in FIG. 4. The light beam 120 propagates along first optical axis 36 at divergence angle α and is focused by isolator 22 and lens 24 into fiber 72. Due to CTE matching between metal layer 14 (specifically metal layer portion 30) and substrate 12, the in-plane thermal expansion of portion 30 is constrained by substrate 12. Thus, misalignment is prevented between laser 16, isolator 22 and lens 24 as well as fiber 72.

In sum, optoelectronic assembly 10 is compatible with high-speed electrical operation and exhibits superior heat dissipation capability together with mechanical stability over a wide temperature range. Furthermore, assembly 10 is simple in construction.

The following embodiments serve to better illustrate in a general manner several important aspects of the invention. It will be appreciated by those skilled in the art that these aspects can be applied in any particular optoelectronic assembly.

Figure 5:
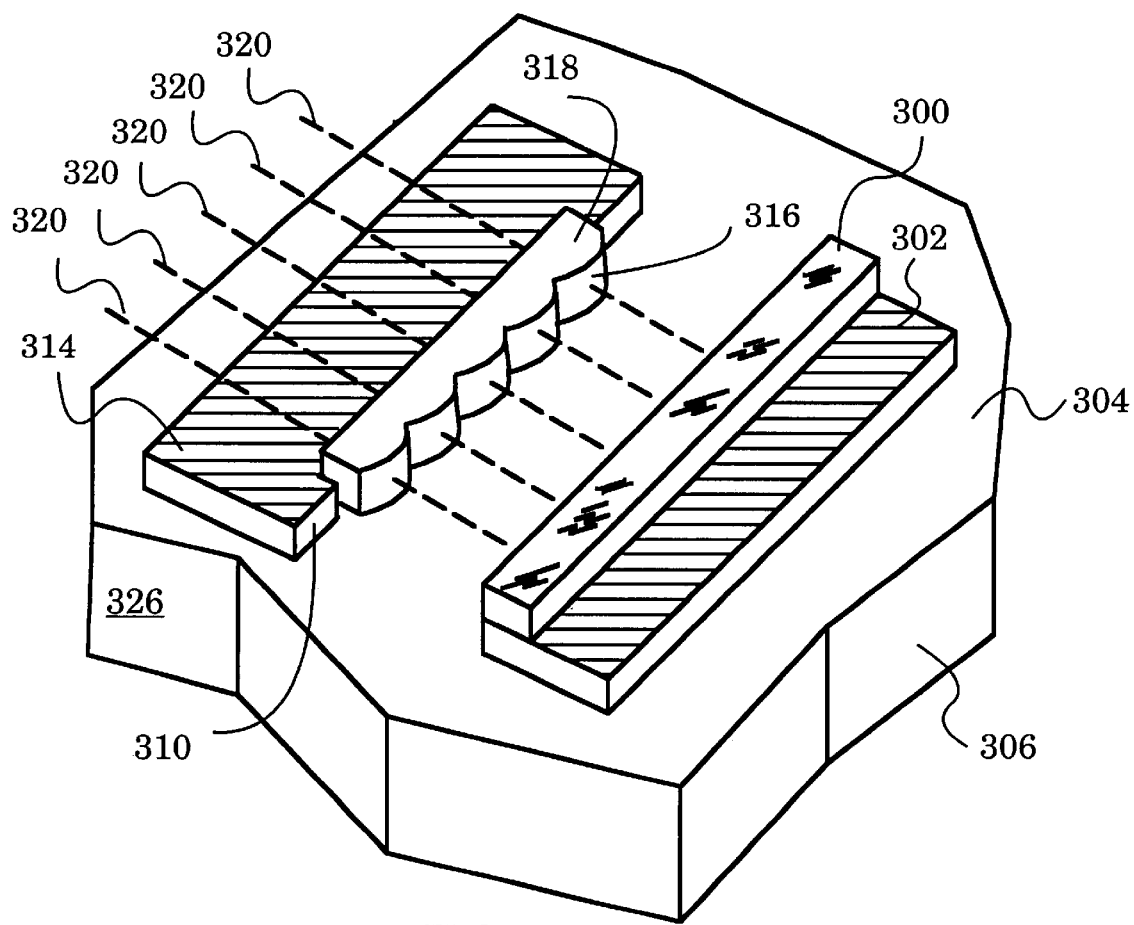
FIG. 5 is a three dimensional view showing the placement of passive elements according to the invention.

An arrangement for aligning multiple laser beams 320 with multiple lenses is shown in Fig. 5. A single-piece lens 318 with multiple lens facets 316 is used. The lens 318 can slide on the surface 304 of the insulating substrate until it is abutted against the step 310 formed by the patterned metal layer 314. The patterned metal layer 314 has a cut-in section to accommodate the lens 318.

This method of placing, guiding, and aligning passive optical elements is convenient and compatible with pick and place techniques. A pick and place machine operates by manipulating a tip that can grasp the optoelectronic and optical components. The tip moves rapidly to place the components in their proper locations on the optoelectronic assemblies. The pick and place machine slides the components until they abut against the side walls of the metal layer. In this way, at least coarse alignment is provided. Coarse alignment reduces the time and expense of active alignment.

The components can be attached to the assembly with a thin layer of hard solder. Preferably, the components are soldered individually using localized heating techniques. Focused laser beams, for example, may be used to heat small regions of the assembly to solder the components individually. Also, resistive heating elements may be used. Resistive heating elements are thin film resistors that heat up when a current is passed through them. If the heating elements are placed in locations on the assembly where components are to be soldered, then they can be independently controlled to solder individual components. Both laser heating and resistive element heating are well known in the art. Alternatively, the components can be attached with a glass solder or a glue such as epoxy. Such attaching techniques are well known in the art.

Figure 7:
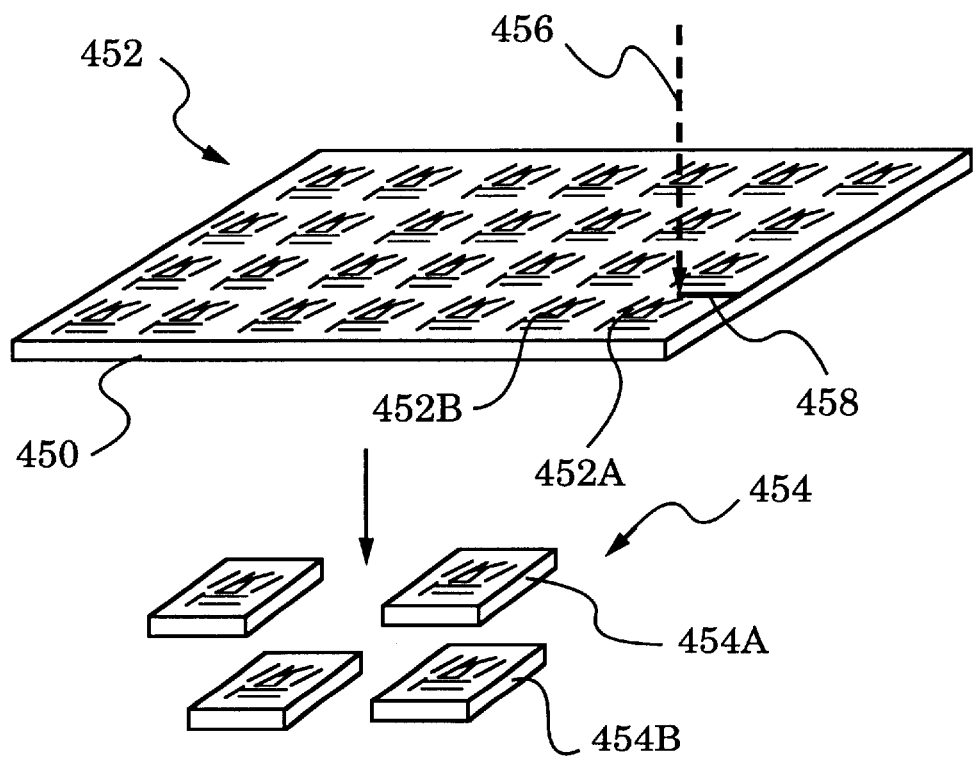
Fig. 7 illustrates a batch manufacturing method according to the invention.

According to a preferred method of the invention, optoelectronic assemblies are produced in a batch process. This method is similar in many respects to that used in the manufacture of integrated circuits, where a large wafer containing many complete circuits is fabricated and then cut into individual chips. In batch production according to the invention, an insulating substrate 450, as shown in FIG. 7, is selected from the group of suitable materials listed above. Metal layers 452 are then bonded to substrate 450. The thicknesses of metal layers 452 ranges between 50 and 1,000 $\mu$m. Precise thickness values are fixed according to the criteria required for heat dissipation, non-interference with light propagation and in-plane CTE constraint by substrate 450.

In fact, metal layers 452 include at least a first metal layer 452A and a second metal layer 452B. For practical applications, first and second metal layers 452A and 452B are identical, since the batch process is designed to fabricate a large number of identical optoelectronic circuits. Metal layers 452A and 452B will generally consist of numerous metal layer portions to accommodate the desired active optical devices, passive optical elements and electronic components.

Metal layers 452 can be produced and patterned by well-known techniques such as: photolithography, etching, stamping, and electro-discharge machining (EDM). Any of these processing techniques can be used to pattern metal layers 452 prior to bonding to substrate 450. Alternatively, metal layers 452 can be produced and patterned by photolithography or diamond sawing after bonding to substrate 450. The individual pre-cut parts can also be plated and brazed.

To produce individual optoelectronic assemblies 454, insulating substrate 450 is divided. The dividing step is performed with any suitable dicing apparatus. In FIG. 7 a cutting beam 456 delivered from a high power laser (not shown) is used to divide substrate 450 along a line 458. Cut assemblies 454A and 454B correspond to portions of substrate 450 bearing metal layers 452A and 452B.

Of course, metal layers 452 expose selected regions where substrate 450 is free for placing passive optical elements and other locations for mounting active optical devices and electrical components on the metal. According to the invention, metal layers 452A and 452B of assemblies 454A and 454B are fitted with the required active optical devices, passive optical elements and electrical components either before or after the dividing step. For example, active optical devices and electrical components can be mounted on the metal layers before dicing, and passive optical elements can be placed on cut assemblies 454A and 454B. The choice of when the individual devices and elements are mounted is up to the designer and can be optimized to ensure efficient batch processing.

Figure 8A:
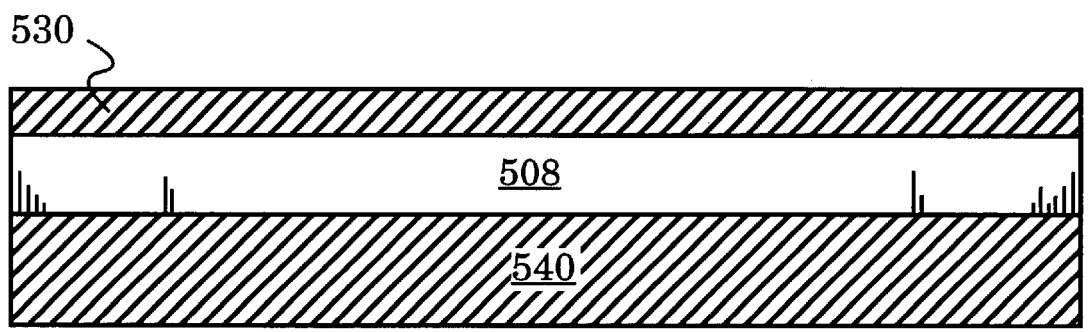
FIGS. 8A–B are cross sectional views showing the fabrication steps for producing patterned metal layers.
Figure 8B:
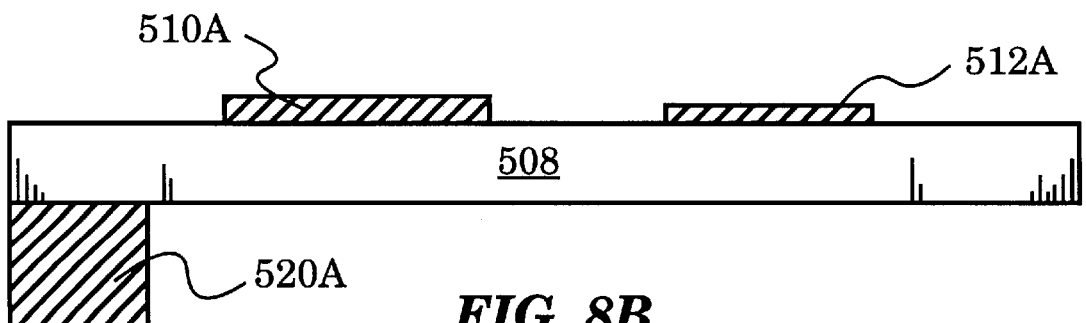

A simple way of preparing a substrate 508 is illustrated in FIGS. 8A and 8B. First, substrate 508 is provided with a top metal layer 530 and a bottom metal layer 540, as shown in FIG. 8A. In a processing step, e.g., etching, top layer 530 is patterned to yield metal layer portions 510A and 512A, and bottom layer 540 is patterned to leave block 520A. This method is advantageous because the patterning of portions 510A and 512A can be carried out independently and simultaneously with the making of block 520A. In another embodiment of the invention intended for high-frequency operation, bottom metal layer 540 can be left intact or merely etched to a desired thickness to provide a ground plane. The actual pattern of the ground plane will be selected based on application.

Figure 6:
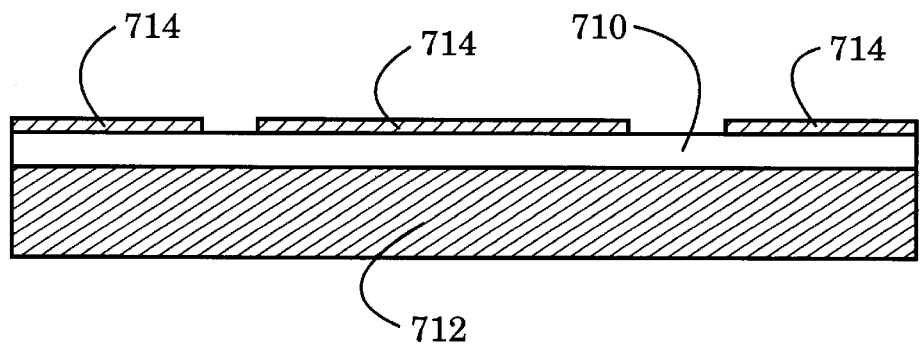
FIG. 6 is a cross-sectional view of an assembly with a substrate made of a metal base layer and a thin dielectric layer on top of the base layer. The patterned metal layer is bonded on top of the dielectric layer.

The substrate used in this invention may not be entirely insulating. FIG. 6 shows a cross sectional side view of an assembly with a substrate composed of a thin layer of dielectric material 710 bonded to an underlying thicker base layer of metal 712. The metal base layer 712 provides the necessary mechanical rigidity. The patterned metal layer 714 is bonded to the dielectric layer. Such substrates are commercially available from The Bergquist Company in Minneapolis, MN. The metal base layer 712 can be copper, aluminum, invar, or other metals and the dielectric layer 710 is preferably ceramic. In this embodiment, the dielectric layer 710 is substantially thinner than the metal base layer 712. The standard metal base layer thickness for these composites is 1–3 mm. The patterned metal layer 714 is the same thickness as in the other embodiments, 50–1000 $\mu$m.

Figure 9:
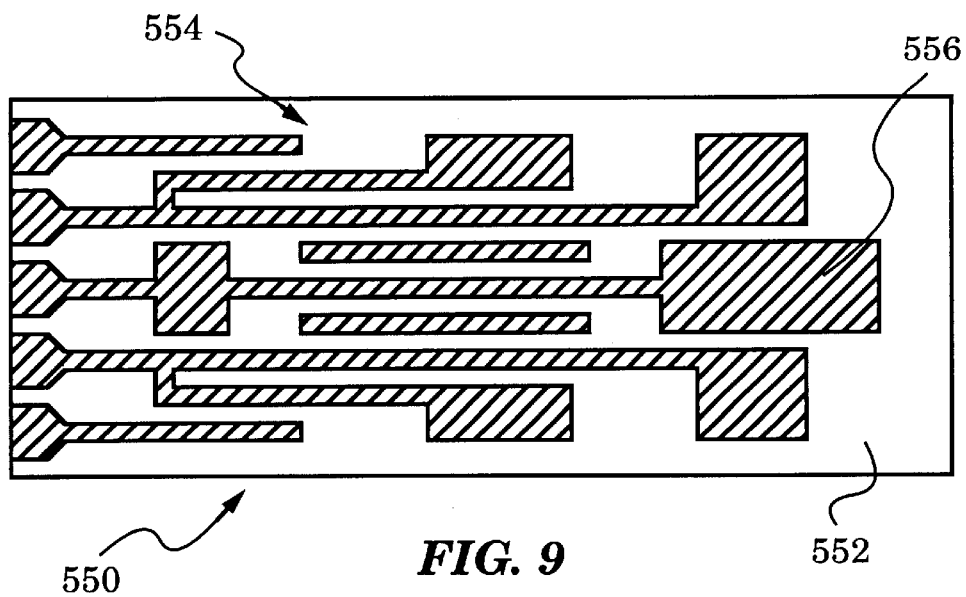
FIG. 9 is a top plan view showing a metal layer patterned as a circuit.

In one advantageous embodiment illustrated in the plan view of FIG. 9, a bottom metal layer 556 is patterned as an electrical circuit 554 on a bottom surface 552 of an insulating substrate 550. Electrical components required for the operation of the corresponding optoelectronic assembly can thus be mounted on bottom surface 552. Clearly, it is also possible to pattern bottom surface 552 for mounting additional optoelectronic devices.

Figure 10A:
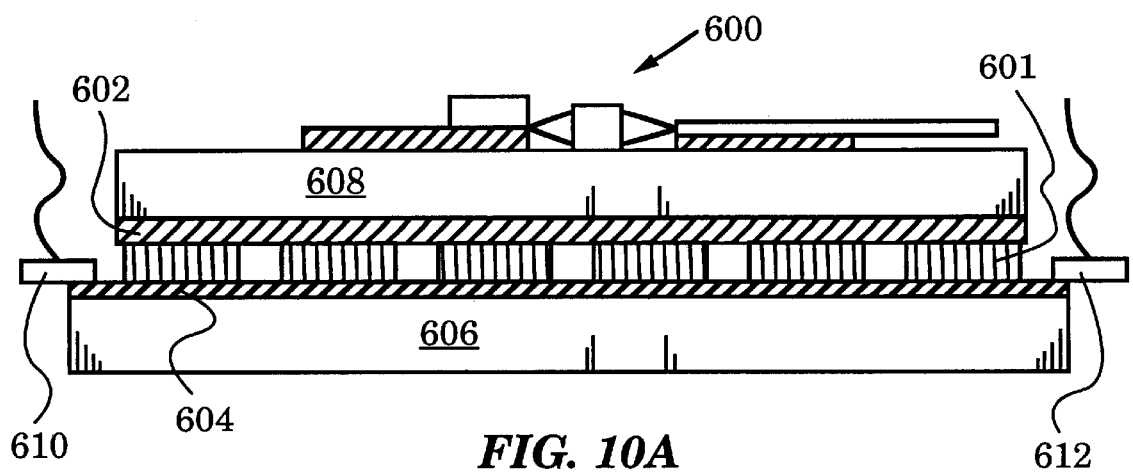
FIG. 10A is a cross sectional view of an embodiment with cooling elements.

FIG. 10A illustrates how an optoelectronic assembly 600 according to the invention is cooled. Cooling elements 601 are mounted between a bottom metal layer 602 on the underside of a substrate 608 and a metal layer 604 on a separate base 606. For example, cooling elements 601 can be Peltier elements or any other electronic devices capable of dissipating heat from substrate 608. Contacts 610, 612 are provided for applying suitable voltages to elements 601 and result in the cooling of assembly 600 during operation. The details of mounting and driving cooling elements are well-known in the art.

Figure 10B:
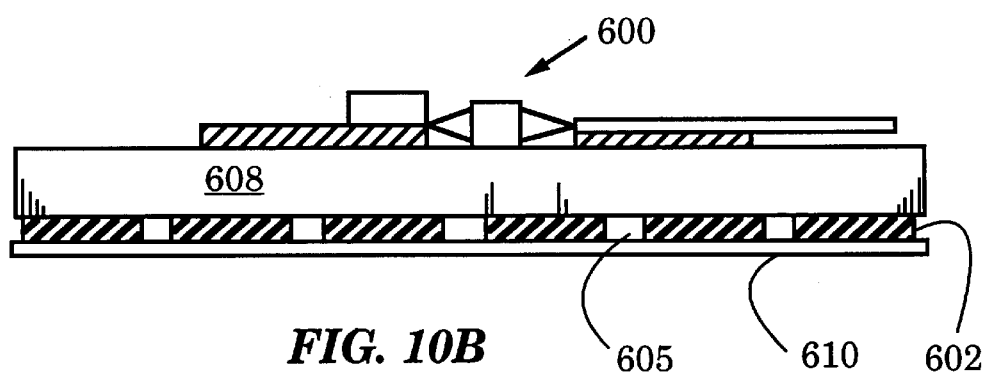
FIG. 10B is a cross sectional view of an embodiment with channels for cooling fluid.

FIG. 10B illustrates how the optoelectronic assembly 600 can also be cooled by liquid coolants flowing through channels 605 etched in the bottom metal layer 602. Of course, a cover 610 for the channels 605 is required in this embodiment. One advantage of optoelectronic assembly 600 is that is has a high hermiticity.

Figure 11:
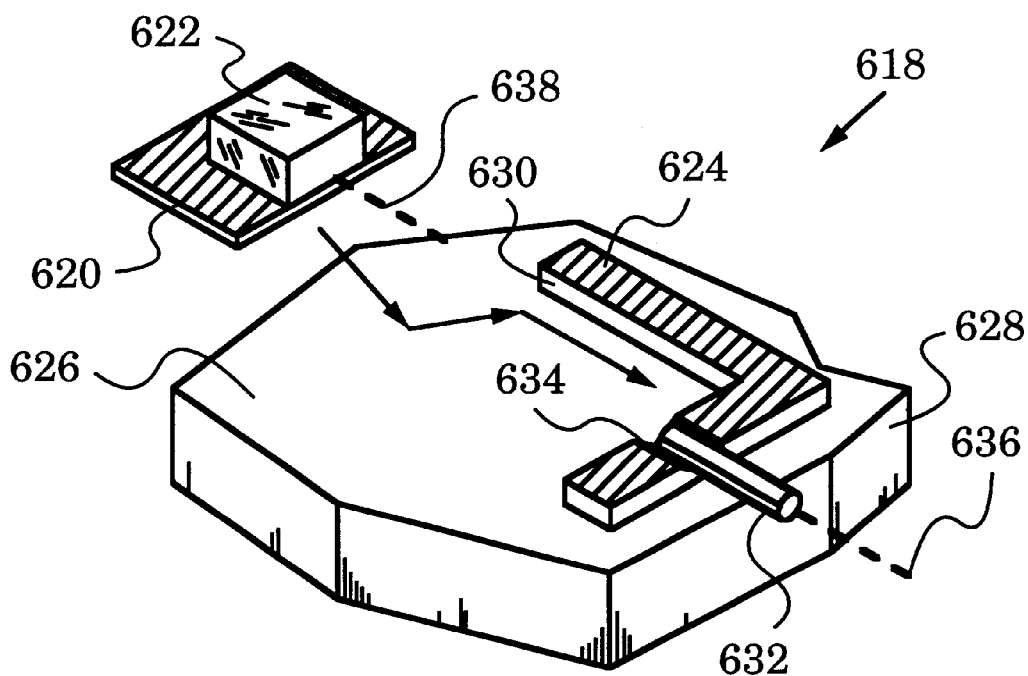
FIG. 11 is an isometric view of a portion of an assembly in which the active device is a submount.
Figure 12:
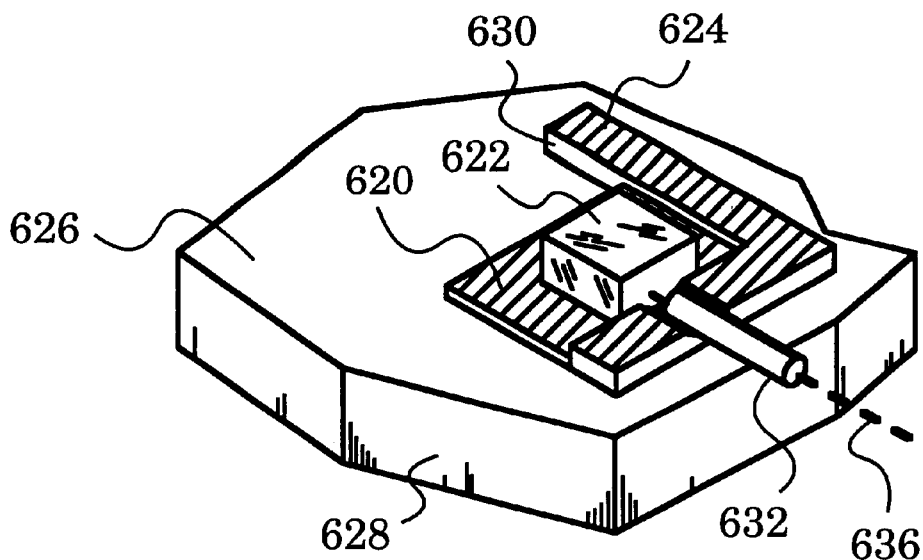
FIG. 12 is an isometric view illustrating the positioning of the active device of FIG. 11.

As shown in FIGS. 11 and 12, the present invention is also well-suited for positioning an active optical device 622 on an optoelectronic assembly 618 (only portion shown). In this embodiment, active optical device 622 is delivered on a submount 620. This adaptation is very useful, since most equipment manufacturers ship active devices, e.g., diode lasers, optical amplifiers, optical modulators and light detectors, which are premounted on submounts.

A Assembly 618 has a metal layer 624 bonded on a planar surface 626 of an insulating substrate 628. A step 630 is formed between substrate 628 and the top surface of layer 624. A fiber 632 is mounted in a notch 634 machined in metal layer 624. In fact, fiber 632 sits at a slight off-set from the edge of layer 624 for better in-coupling of light from device 622.

During placement of optical device 622 in assembly 618, a second optical axis 636 of fiber 632 is aligned with a first optical axis 638 of device 622. Device 622 is oriented such that axis 638 is parallel to surface 626 of substrate 628. For this purpose step 630 is used as a fiduciary to slide submount 620 into the aligned position illustrated in FIG. 11. The arrows in FIG. 11 show how submount 620 is displaced on surface 626 using step 630. Of course, in this embodiment submount 620 is used as part of the electrical path to device 622. Additional passive elements having their own optical axes—i.e., a third optical axis—can be positioned and aligned on substrate 628 with optical axis 638 of device 622.

Figure 13:
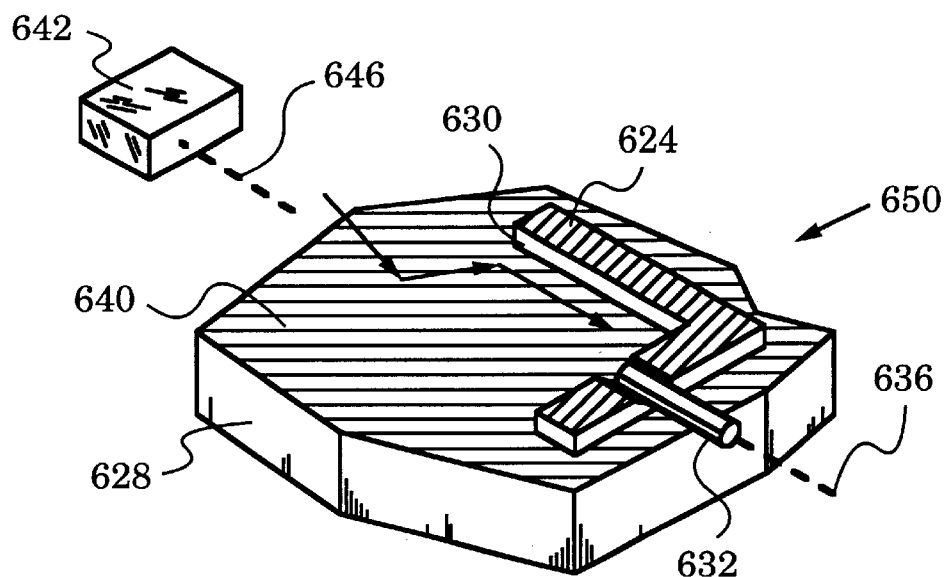
FIG. 13 is an isometric view illustrating the positioning of a free-standing active device in an assembly portion similar to that of FIG. 11.

FIG. 13 illustrates how an active optical device 642 having a first optical axis 646 and no submount can be positioned on a metalized planar surface 640 of an optoelectronic assembly 650. The metalization of surface 640 provides the necessary electrical path to device 642. Otherwise, assembly 650 is identical to assembly 618 and the positioning steps are analogous to those illustrated in FIGS. 11 and 12.

Figure 14:
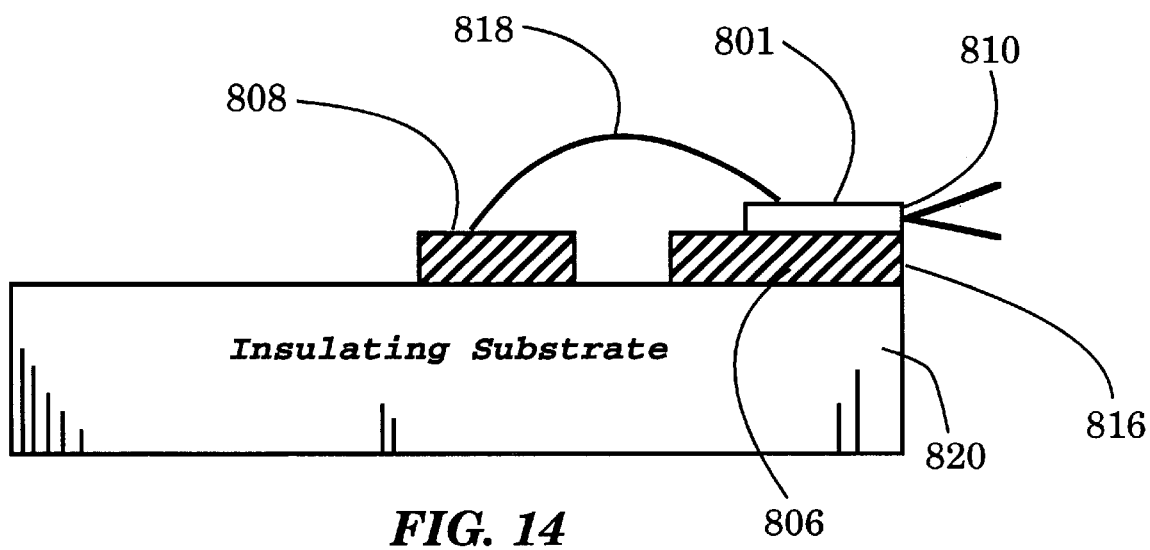
FIG. 14 is a side view of an embodiment wherein the active optical element (laser) is edge mounted. This embodiment can be used as a subassembly.

FIG. 14 illustrates a particularly useful assembly wherein an optoelectronic component such as a laser diode 801 is edge-mounted on the assembly. The edge 810 of the laser 801, edge 816 of the metal layer 806, and edge 820 of the insulating substrate are all flush. This arrangement can function as a sub-assembly and be incorporated into a larger optoelectronic package. Preferably, this embodiment incorporates the advantageous features described above. Specifically, the metal layer 806 provides heat dissipation and has a constrained CTE. Also, the metal layer 806 is patterned to provide electrical contacts 808 for the laser 801. A wire 818 provides an electrical connection for the laser 801. Direct bond copper-on-ceramic is a preferred material for this application. Of course, these assemblies can be manufactured using batch processing techniques.

It will be clear to one skilled in the art that the above embodiments may be altered in many ways to produce an optoelectronic assembly performing any desired function by selecting the appropriate components. This will be done without departing from the scope of the invention. Additional modifications, such as providing multiple metal layers formed by bonding additional metal layers on top of existing metal layers, or patterning the additional metal layers before or after bonding, are also envisioned by the invention. Accordingly, the scope of the invention should be determined not by the examples given but by the following claims and their legal equivalents.

What is claimed is:

1. A method of making an optoelectronic assembly comprising:
    a) selecting an insulating substrate with a planar surface;
    b) bonding a metal layer to said planar surface such that selected regions of said insulating substrate are exposed and a step is produced between said insulating substrate and a top surface of said metal layer;
    c) mounting an active optical device having a first optical axis on said metal layer such that said first optical axis is parallel to said insulating substrate, and such that said metal layer provides an electrical path to said active optical device;
    d) selecting a predetermined thickness for said metal layer such that:
        i) heat generated by said active optical device is dissipated;
        ii) said insulating substrate does not interfere with the propagation of light along said first optical axis; and
        iii) the in-plane coefficient of thermal expansion (CTE) of said metal layer is constrained by said insulating substrate, such that said metal layer inherits the in-plane CTE of said insulating substrate.

2. The method of claim 1 wherein said active optical device is selected from the group consisting of diode lasers, optical amplifiers, optical modulators, optical switches, optical fibers, and light detectors.

3. The method of claim 1 further comprising patterning said metal layer.

4. The method of claim 1 wherein said metal layer is made of a material selected from the group consisting of copper, copper-tungsten, copper alloys, copper composites, copper plated materials, copper clad materials, and copper laminates.

5. The method of claim 1 wherein said insulating substrate is selected from ceramics from the group consisting of alumina, BeO and AlN.

6. The method of claim 1 further comprising forming said metal layer by a process selected from the group consisting of photolithography, etching, stamping, brazing, electrodeposition, and electro-discharge machining (EDM) before bonding said metal layer to said planar surface.

7. The method of claim 1 further comprising forming said metal layer by a process selected from the group consisting of photolithography and diamond sawing after bonding said metal layer to said planar surface.

8. The method of claim 1 further comprising polishing said metal layer to said predetermined thickness.

9. The method of claim 1 further comprising etching said metal layer to said predetermined thickness.

10. The method of claim 1 further comprising placing a passive optical element having a second optical axis in one of said selected regions such that said second optical axis is aligned with said first optical axis.

11. The method of claim 10 wherein placing the passive optical element includes actively displacing said passive optical element in one of said selected regions.

12. The method of claim 10 wherein placing the passive optical element includes displacing said passive optical element with said step serving as a fiduciary along which said passive optical element is displaced.

13. A method of making at least two optoelectronic assemblies comprising:
   a) selecting an insulating substrate with a planar surface;
   b) bonding at least a first and second metal layers to said planar surface such that selected regions of said insulating substrate are exposed and steps are produced between said insulating substrate and top surfaces of said metal layers;
   c) mounting active optical devices each having first optical axes on said metal layers such that said first optical axes are parallel to said insulating substrate, and such that said metal layers provide electrical paths to said active optical devices;
   d) selecting a predetermined thickness for said metal layers such that:
      i) heat generated by said active optical devices is dissipated;
      ii) said insulating substrate does not interfere with the propagation of light along said first optical axes;
      iii) the in-plane coefficient of thermal expansion (CTE) of said metal layers is constrained by said insulating substrate, such that said metal layer inherits the in-plane CTE of said insulating substrate; and
   e) dividing said insulating substrate into at least a first and second parts, each of said parts including one of said metal layers.

14. The method of claim 13 further comprising forming said metal layers by a process selected from the group consisting of photolithography, etching, stamping, brazing, electrodeposition and electro-discharge machining before bonding said at least first and second metal layers to said planar surface.

15. The method of claim 13 further comprising forming said metal layers by a process selected from the group consisting of photolithography, etching and diamond sawing after bonding said at least first and second metal layers to said planar surface.

16. The method of claim 13 wherein bonding said at least first and second metal layers to said planar surface is performed after dividing said insulating substrate.

17. The method of claim 13 further comprising placing passive optical elements in said selected regions.

18. The method of claim 17 wherein placing the passive optical elements is performed before dividing said insulating substrate.

19. The method of claim 17 wherein placing the passive optical elements is performed after dividing said insulating substrate.

20. A method of making an optoelectronic assembly comprising:
   a) selecting an insulating substrate with a planar surface;
   b) bonding a metal layer to said planar surface such that selected regions of said insulating substrate are exposed and a step is produced between said insulating substrate and a top surface of said metal layer;
   c) placing a first active optical device having a first optical axis on a sub mount;
   d) positioning said sub mount on said insulating substrate where said step is a fiduciary for aligning said first active optical device such that said first optical axis is parallel to said insulating substrate, said sub mount further providing an electrical path to said first active optical device and having a predetermined thickness such that:
      i) heat generated by said first active optical device is dissipated through said sub mount; and
      ii) said insulating substrate does not interfere with the propagation of light along said first optical axis.

21. The method of claim 20 wherein said first active optical device is selected from the group consisting of diode lasers, optical amplifiers, optical modulators, optical switches, optical fibers, and light detectors.

22. The method of claim 20 further comprising a first passive optical element having a second optical axis and being positioned in one of said selected regions such that said second optical axis is aligned with said first optical axis.

23. The method of claim 22 wherein said passive optical element is positioned on said insulating substrate.

24. The method of claim 20 further comprising a second active optical device having a third optical axis and being mounted on said metal layer such that said third optical axis is aligned with said first optical axis.

25. The method of claim 20 wherein said predetermined thickness ranges between 50 $\mu$m and 1,000 $\mu$m.

26. A method of making an optoelectronic assembly comprising:
   a) selecting an insulating substrate with a planar surface;
   b) bonding a metal layer to said planar surface such that selected regions of said insulating substrate are exposed and a step is produced between said insulating substrate and a top surface of said metal layer;
   c) providing said planar surface with a metalization;
   d) positioning an active optical device having a first optical axis on said metalization of said insulating substrate where said step is a fiduciary for aligning said active optical device such that said first optical axis is parallel to said insulating substrate, said metalization further providing an electrical path to said active optical device.

27. A method of making an optoelectronic assembly comprising:
   a) bonding a metal layer with an edge to a planar surface of an insulating substrate having an edge, such that said metal layer edge is flush with said insulating substrate edge, selected regions of said insulating substrate are exposed and a step is produced between said insulating substrate and a top surface of said metal layer;
   b) placing a first active optical device having a first optical axis and an edge on a sub mount;
   c) positioning said sub mount on said insulating substrate such that said active device edge is flush with said metal layer edge and said first optical axis is parallel to said insulating substrate, said submount further providing an electrical path to said first active optical device and having a predetermined thickness such that:
      i) heat generated by said first active optical device is dissipated through said sub mount; and
      ii) said insulating substrate does not interfere with the propagation of light along said first optical axis.

28. The method of claim 27 wherein the predetermined thickness is such that the in-phone coefficient of thermal expansion (CTE) of said metal layer is constrained by said insulating substrate such that said metal layer inherits the in-plane CTE of said insulating substrate.

29. The method of claims 27 wherein said first active optical device is selected from the group consisting of diode lasers, optical amplifiers, optical modulators, optical switches, optical fibers, and light detectors.

30. The method of claim 27 further comprising a first passive optical element having a second optical axis and being positioned in one of said selected regions such that said second optical axis is aligned with said first optical axis.

31. The method of claim 30 wherein said passive optical element is positioned on said insulating substrate.

32. The method of claim 27 further comprising a second active optical device having a third optical axis and being mounted on said metal layer such that said third optical axis is aligned with said first optical axis.

33. The method of claim 27 wherein said predetermined thickness ranges between 50 $\mu$m and 1,000 $\mu$m.

* * * * *